United States Patent [19]

Muldoon, Jr.

[11] 4,365,411
[45] Dec. 28, 1982

[54] METHOD AND MEANS FOR INSERTION OF INSERTS INTO A HOLE OF A PREDRILLED BOARD

[75] Inventor: Edward M. Muldoon, Jr., Dana Point, Calif.

[73] Assignee: Bivar, Inc., Santa Ana, Calif.

[21] Appl. No.: 182,138

[22] Filed: Aug. 28, 1980

[51] Int. Cl.³ .................... H05K 3/00; B23P 19/00
[52] U.S. Cl. ................................ 29/845; 29/739; 29/268; 29/761; 81/307; 81/308; 227/60; 227/144
[58] Field of Search .............. 29/267, 268, 842, 845; 72/409, 410; 81/5.1 R, 5.1 B, 303, 304, 307, 308; 227/60, 143, 144

[56] References Cited

U.S. PATENT DOCUMENTS

| | | | |
|---|---|---|---|
| 1,005,269 | 10/1911 | Michel et al. | 227/143 X |
| 2,899,852 | 8/1959 | Burgess | 72/409 |
| 3,022,510 | 2/1962 | O'Malley | 227/144 X |
| 3,484,937 | 12/1969 | Campbell, Jr. et al. | 29/845 |
| 3,826,160 | 7/1974 | Allen et al. | 81/5.1 R |
| 4,227,299 | 10/1980 | Kuehling | 72/410 X |

Primary Examiner—Francis S. Husar
Assistant Examiner—Carl J. Arles
Attorney, Agent, or Firm—A. C. Smith

[57] ABSTRACT

An apparatus and technique are provided to automatically align an insert for insertion into a hole of a predrilled board. The hole is located by a retractable centering pin on the apparatus to ensure an accurate alignment with the insert, and, once aligned, the insert is inserted into the hole with a force axially applied by the apparatus.

4 Claims, 3 Drawing Figures

METHOD AND MEANS FOR INSERTION OF INSERTS INTO A HOLE OF A PREDRILLED BOARD

BACKGROUND AND SUMMARY OF THE INVENTION

In the field of printed circuit boards, many occasions arise in which an insert needs to be inserted into a hole in a predrilled board, either to affix a component to the board or to provide a common connection between the two sides of the board. In the first instance, the insert could be a retaining pin. When it is inserted through a hole in the component and in the board, the pin effectively provides the necessary tension to hold the component to one board. In the second instance, the insert could be a hollow pin such that once inserted, both ends of the pin could be flared and soldered to the conductive traces on the two sides of the board to form a conductive through hole.

In the prior art, insertion of such inserts typically required careful manual alignment of the insert with the hole. Because the insert is necessarily small in most cases, e.g., 0.5 cm long, maintaining the alignment with one hand and applying the force necessary for inserting the insert with the other hand presented a difficult and time-consuming task for most operators. Furthermore, the manual insertion provided inconsistent results; a misalignment of the insert with the hole when an axial force is applied would result in either damage to the board or a skewed insertion that may not operate effectively. Similar undesirable results can occur when the insertion force is applied monaxially.

The preferred embodiment in accordance with the invention provides an apparatus and technique that automatically aligns the insert axially with the hole in the predrilled board and applies a substantially axial force to the insert upon insertion. An insert-feeding orifice in the apparatus is aligned to a centering pin used for locating and centering the hole. When the insert is fed into the orifice, it is automatically aligned with the hole. Thereafter, the force necessary to force the insert into the hole is axially applied to the insert in a fixed and correct relationship to ensure an accurate and uniform insertion. Thus, this technique obviates the need for a skillful and highly dexterous operator for such insertions.

DESCRIPTION OF THE PREFERRED EMBODIMENTS

Figure 1:
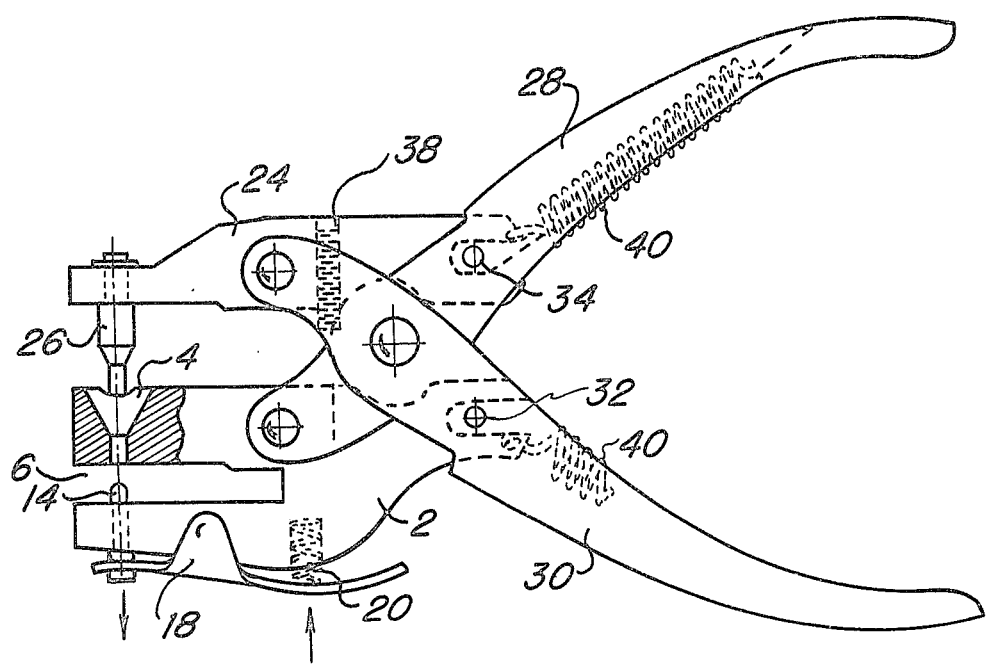
FIG. 1 shows the preferred embodiment of the insertion apparatus in accordance with the invention.
Figure 2:
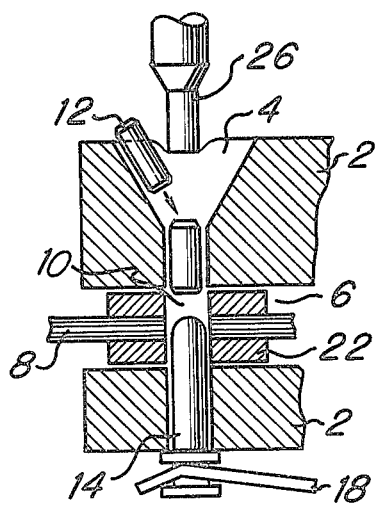
FIG. 2 shows a detail of an insert being automatically aligned for insertion.
Figure 3:
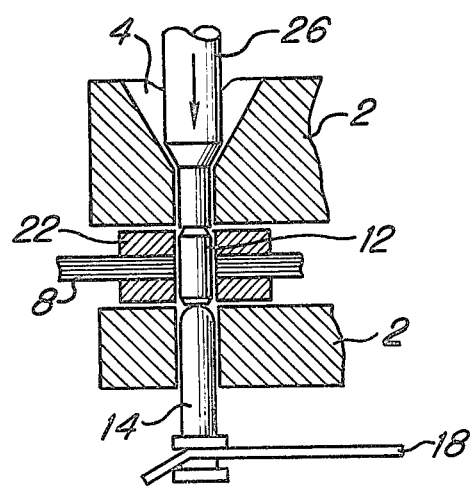
FIG. 3 shows a detail of an insert being inserted into a board and the centering pin being retracted.

In the preferred embodiment of the invention as shown in FIGS. 1 and 2, a first piece 2 has a funnel-shaped orifice 4 located near one end of it. Orifice 4 extends through first piece 2 to a gap 6 for receiving a board 8 with a predrilled hole 10 in it. When insert 12 is fed into funnel-shaped orifice 4, insert 12 is automatically aligned to a centering pin 14 located directly in line with orifice 4 on the other side of gap 6. Centering pin 14 is made retractable by means of a lever 18 that is connected at one end to centering pin 14 and that is also pivotally attached to first piece 2. Lever 18 further has a spring 20 attached to the other end of it that feeds into first piece 2 so that centering pin 14 remains extended into gap 6 to locate and center the hole 10 on the predrilled board 8. But because lever 18 is pivotally attached, centering pin 14 can be retracted from gap 6 by pivoting lever 18. Pin 14 can also be retracted in response to insert 12 being forced into the hole 10. This situation is shown in FIG. 3.

For applying the necessary axial force to insert 12 for insertion into board 8, such as for affixing a component 22 to board 8, a second piece 24 having an insertion pin 26 attached thereto is used. For a proper application of force, insertion pin 26 must be in line with and move axially to orifice 4 and centering pin 14. In operation, then, insertion pin 24 forces insert 12 through the orifice 4, into the component 22, and into the hole 10 in board 8, thus facilitating the affixing of component 22 onto board 8.

The insertion force applied through insertion pin 26 can be obtained by means of two pivotally cross-connected levers 28 and 30. In the preferred embodiment, lever 28 has first piece 2 attached to one end, and lever 30 has second piece 24 also attached to one end. To stabilize first and second pieces 2 and 24 and to ensure that each would move towards and in parallel to each other, first piece 2 is further attached to lever 30 with a retaining pin 32 that allows first piece 2 to slide partially to remain parallel to second piece 24 at all times. Likewise, second piece 24 is also further attached to lever 28 with a retaining pin 34 that allows a partial sliding movement for the same reason. Thus, when force is applied to the other end of levers 28 and 30 to pivot them together, the force is translated to first and second pieces 2 and 24 to cause them to move towards each other in parallel, simultaneously maintaining the common alignment of insertion pin 26, orifice 4, and centering pin 14. An adjustable stop screw 38 is provided on second piece 24 to limit how closely the two parallel pieces 2 and 24 can mate.

Attached to first and second pieces 2 and 24 is a spring 40 held in tension in respect to levers 30 and 28, respectively. The spring 40 to each piece 2 and 24 serves to maintain a separation of the two pieces 2 and 24 in the absence of a pivoting force on the levers 28 and 30. In this way, insertion pin 26 is kept withdrawn from orifice 4 and is poised for the next insertion operation.

I claim:

1. A method for inserting an insert into a hole on a predrilled workpiece comprising the steps of:
    inserting a retractable centering pin from one side of the workpiece into the hole for centering the hole axially;
    aligning the insert axially to the centering pin from the opposite side of the workpiece;
    inserting the insert axially into the hole with a force substantially axial to the hole; and
    retracting the centering pin in response to the insertion of the insert.

2. An apparatus for inserting an insert into a hole of a predrilled workpiece, comprising:
    first and second members mounted for relative movement with respect to each other;
    first means disposed on the first member for aligning the hole and the insert to permit insertion of the insert into the hole from one side of the workpiece;

second means disposed on the second member to apply an axial force to the insert for insertion into the hole;

third means retractably mounted on the opposite side of the workpiece and disposed to be positioned within the hole for centering the hole in axial alignment with the insert; and means coupled to the first and second members to impart relative movement thereto in a direction toward each other for inserting the insert within the hole and for retracting the third means from the hole in response to insertion therein of the insert.

3. An apparatus for inserting an insert into a hole of a predrilled workpiece, comprising:

first and second members mounted for relative movement with respect to each other;

first means disposed on the first member for aligning the hole and the insert to permit insertion of the insert into the hole from one side of the workpiece, said first means including a gap for receiving the predrilled workpiece, and a funnel-shaped orifice disposed in the first member on one side of the gap for aligning the insert axially with the hole for insertion;

second means disposed on the second member to apply an axial force to the insert for insertion into the hole;

third means including a centering pin retractably mounted on the first member on the opposite side of said gap to protrude into the gap and into the hole for centering the hole in axial alignment with the insert; and means coupled to the first and second members to impart relative movement thereto in a direction toward each other for inserting the insert within the hole and for retracting the centering pin from the hole in response to insertion therein of the insert.

4. Apparatus according to claim 3 wherein:

said means establish substantially parallel movement between the first and second members in response to applied force;

said second means includes an insertion pin in line with said orifice for application of an insertion force through said orifice upon the insert; and spring means connected to at least one of the first and second members for resiliently urging separation therebetween in the absence of applied force.

* * * * *